(12) United States Patent
Shiah et al.

(10) Patent No.: US 8,223,566 B2
(45) Date of Patent: Jul. 17, 2012

(54) MEMORY DEVICE AND MEMORY CONTROL METHOD

(75) Inventors: Chun Shiah, Hsinchu (TW); Shi-Huei Liu, Hsin Chu County (TW)

(73) Assignee: Etron Technology, Inc., Hsin Chu (TW)

( * ) Notice: Subject to any disclaimer, the term of this patent is extended or adjusted under 35 U.S.C. 154(b) by 198 days.

(21) Appl. No.: 12/850,283

(22) Filed: Aug. 4, 2010

(65) Prior Publication Data

US 2011/0032781 A1 Feb. 10, 2011

(30) Foreign Application Priority Data

Aug. 5, 2009 (TW) .................................. 98126307 A (51) Int. Cl.
*G11C 7/00* (2006.01)
(52) U.S. Cl. ................ 365/200; 365/189.05; 365/230.08
(58) Field of Classification Search .................. 365/200, 365/189.05, 230.08
See application file for complete search history.

(56) References Cited

U.S. PATENT DOCUMENTS 5,841,711 A 11/1998 Watanabe
7,180,801 B2 * 2/2007 Ferrant et al. ................. 365/200

FOREIGN PATENT DOCUMENTS

CN 1302482 C 2/2007
* cited by examiner

*Primary Examiner* — Son Dinh
*Assistant Examiner* — Nam Nguyen
(74) *Attorney, Agent, or Firm* — Muncy, Geissler, Olds & Lowe, PLLC (57) ABSTRACT

The embodiments of the present invention disclose a memory device having a fast and shared redundancy decision scheme and a memory control method. The memory device includes an address receiver, a command receiver, a command controller, a row address generator, a column address generator and a shared redundancy decision circuit.

21 Claims, 5 Drawing Sheets

MEMORY DEVICE AND MEMORY CONTROL METHOD

BACKGROUND OF THE INVENTION (a) Field of the Invention

The invention relates to a memory device, particularly to a memory device having a shared redundancy decision scheme.

(b) Description of the Related Art

Figure 1A:
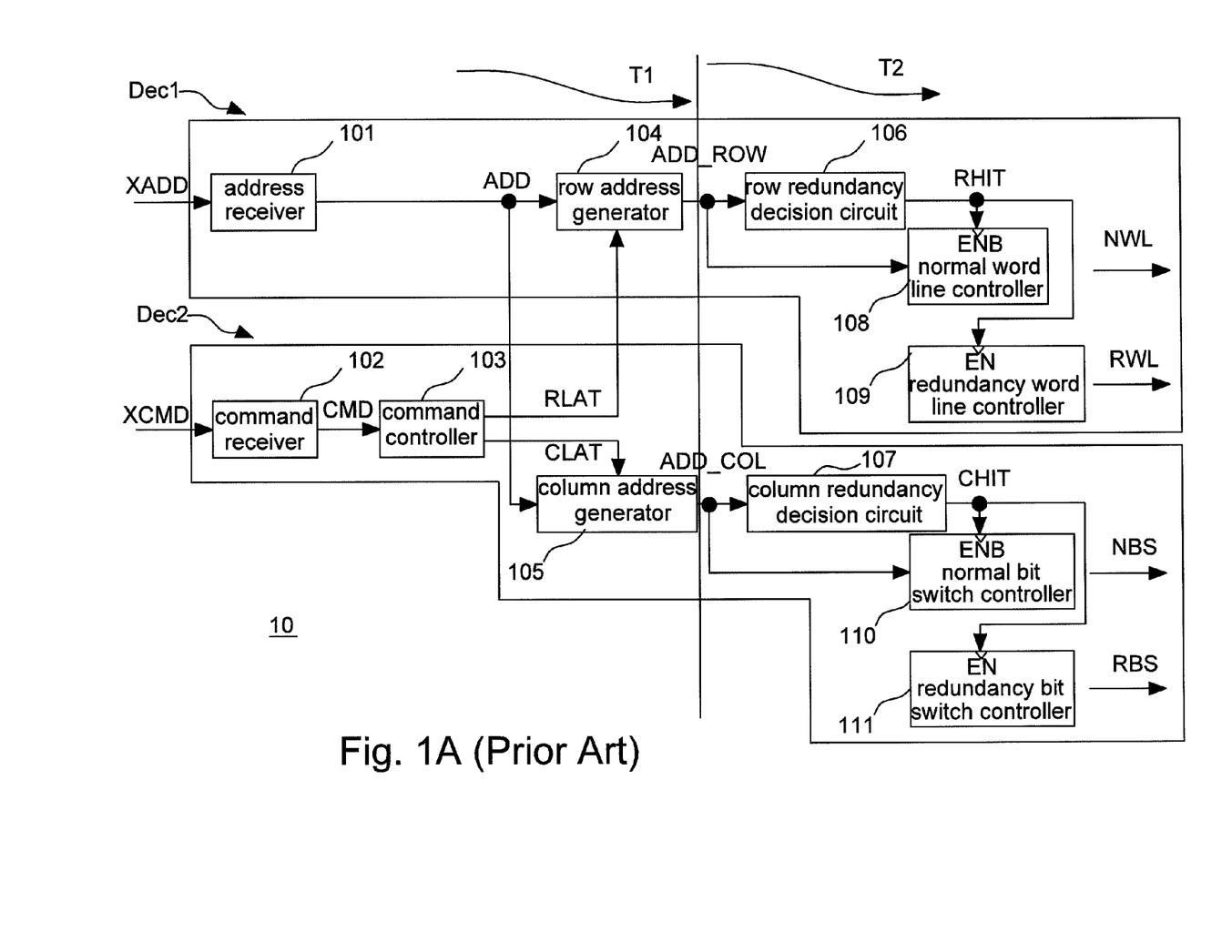
FIG. 1A shows a schematic diagram illustrating a memory device according to the prior art.

The shared redundancy decision scheme for a conventional memory device 10 is shown in FIG. 1A that needs two sets of shared redundancy decision circuits, one of which is a row decision circuit Dec1 and the other of which is a column decision circuit Dec2.

The row decision circuit Dec1 comprises an address receiver 101, a row address generator 104, a row redundancy decision circuit 106, a normal word line controller 108, normal word lines NWL, a redundancy word line controller 109, and redundancy word lines RWL while the column decision circuit Dec2 comprises a command receiver 102, a command controller 103, a column address generator 105, a column redundancy decision circuit 107, a normal bit switch controller 110, normal bit switches NBS, a redundancy bit switch controller 111, redundancy bit switches RBS.

Figure 1B:
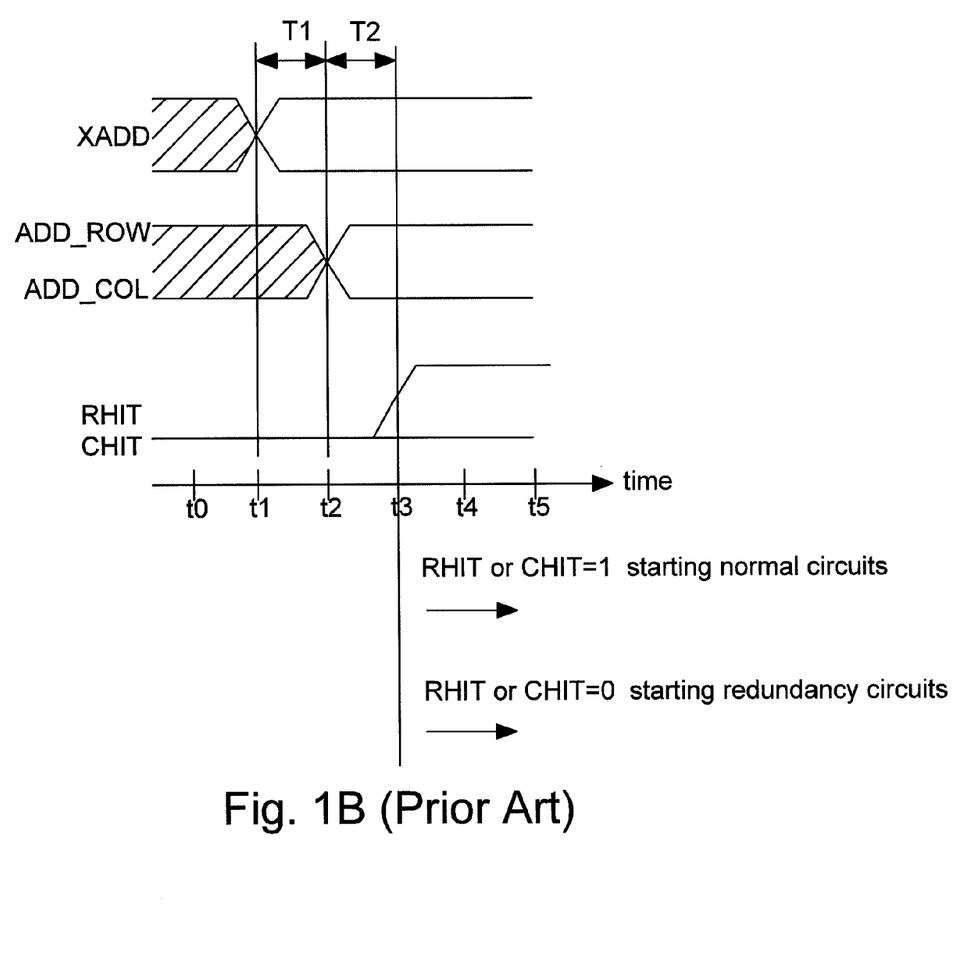
FIG. 1B shows a waveform diagram illustrating the operation of the memory device shown in FIG. 1A.

Please refer to FIGS. 1A and 1B simultaneously. As the conventional memory device 10 is in operation, the address receiver 101 receives external address information XADD to generate internal address information ADD and then output the internal address information ADD to the row address generator 104 or the column address generator 105. The command receiver 102 receives an external command XCMD to generate an internal command CMD and then the command controller 103 decides how to generate a row latch control signal RLAT or a column latch control signal CLAT to control the row address generator 104 or the column address generator 105 based on the internal command CMD so as to generate a latched row address ADD_ROW or column address ADD_COL. As shown in FIG. 1B, from the time t1 completing processing the external address information XADD to the time t2 deciding the latched address ADD_ROW or ADD_COL, the conventional memory device 10 takes the time length T1.

According to the design in the prior art, the row or column redundancy decision circuit 106 or 107 has to receive the latched row or column address ADD_ROW or ADD_COL outputted by the row address generator 104 or the column address generator 105 at the time t2 and then can decide whether to set the generated row redundancy start signal RHIT or the generated column redundancy start signal CHIT to enable (logic 1) or disable (logic 0) to start the part of the normal circuits or the redundancy circuits at the time t3 based on the latched row or column address ADD_ROW or ADD_COL. Therefore, as shown in FIG. 1B, the row or column redundancy decision circuit 106 or 107 of the conventional memory device 10 takes the time length T2 for the redundancy decision.

It should be noted, even if the latched row or column address ADD_ROW or ADD_COL are transmitted to the word line controller 108, 109 or to the bit switch controller 110, 111, the data in the conventional memory device 10 cannot be accessed until the decision operation on the normal circuits and the redundancy circuits by the row or column redundancy decision circuit 106 or 107 is completed. Therefore, it takes time and greatly reduces the processing speed.

BRIEF SUMMARY OF THE INVENTION

In view of the above problems, one object of the invention is to provide a memory device having a fast shared redundancy decision scheme.

One object of the invention is to provide a memory device utilizing only one shared redundancy decision circuit instead of two in the prior art to reduce the production cost.

One embodiment of the invention provides a memory device, comprising an address receiver, a command receiver, a command controller, a row address generator, a column address generator, and a shared redundancy decision circuit. The address receiver receives and converts external address information to generate internal address information. The command receiver receives and converts an external command to generate an internal command. The command controller generates a row latch control signal or generates a column latch control signal based on the internal command. The row address generator receives the internal address information and decides how to convert the internal address based on the row latch control signal so as to generate a latched row address. The column address generator receives the internal address information and decides how to convert the internal address based on the column latch control signal so as to generate a latched column address. The shared redundancy decision circuit receives the internal address information and then either generates a row redundancy start signal based on the internal address information and the row latch control signal or generates a column redundancy start signal based on the internal address information and the column latch control signal.

In the above, when the row redundancy start signal or column redundancy start signal generated by the shared redundancy decision circuit is at a first voltage level, the memory device starts a normal word line circuit of the corresponding latched row address or starts a normal bit switch circuit of the corresponding latched column address. When the row redundancy start signal or column redundancy start signal generated by the shared redundancy decision circuit is at a second voltage level, the memory device starts a redundancy word line circuit of the corresponding latched row address or starts a redundancy bit switch circuit of the corresponding latched column address.

Another embodiment of the invention provides a memory device, comprising a memory circuit and a shared redundancy decision circuit. The memory circuit receives address information and command information to generate a non-latched address, a row latch signal or a column latch signal, and a latched row address or a latched column address. The shared redundancy decision circuit decides to start the normal circuit of the row or column or to start the redundancy circuit of the row or the column in advance based on the non-latched address and the row latch signal or the column latch signal, before the latched row address or the latched column address is outputted to the normal circuit of the row or column of a storage unit of the memory device or to the redundancy circuit of the row or the column of a storage unit of the memory device.

Another embodiment of the invention provides a memory control method. The method comprises the following steps. At first, address information and command information are received to generate a non-latched address, a row latch signal or a column latch signal, and a latched row address or a latched column address. Then, redundancy decision is performed by deciding to start the normal circuit of the row or column or to start the redundancy circuit of the row or the column in advance based on the non-latched address and the row latch signal or the column latch signal, before the latched row address or the latched column address is outputted to the normal circuit of the row or column of a storage unit of the memory device or to the redundancy circuit of the row or the column of a storage unit of the memory device. Finally, data in the memory are accessed based on the normal circuit of the row or column or the redundancy circuit of the row or the column.

The memory device and the memory control method of the embodiments of the present invention utilize the non-latched internal address converted from the external address information and the internal command including fuse information converted from the external command to perform comparison and decision before the row or column address is latched. Through this way, the decision of the redundancy scheme of the memory device of the embodiments of the present invention can be quickly ready before the information of the latched row or column address is transferred to the subsequent circuit like the word line controller or the bit switch controller. The memory device can perform data accessing right after the information of the latched row or column address is ready without taking additional time to wait for generating the row or column redundancy start signal. Moreover, since the memory device according to the embodiments of the present invention utilizes the shared redundancy decision circuit, only one redundancy decision circuit is needed instead of two redundancy decision circuits (row and column redundancy decision circuits) in the prior art so that the production cost can be greatly reduced.

DETAILED DESCRIPTION OF THE INVENTION

The following describes the memory device of the embodiments of the inventions, accompanying with drawings.

Figure 2A:
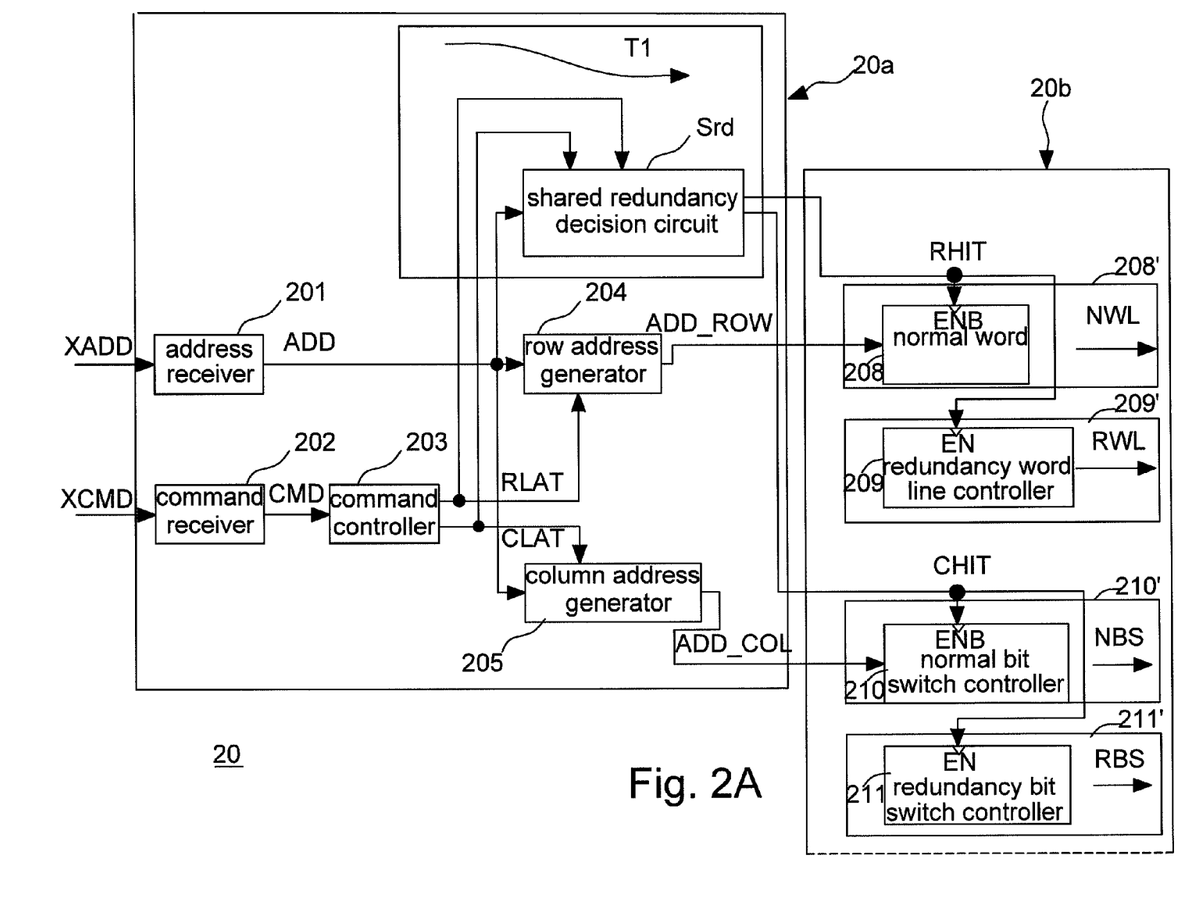
FIG. 2A shows a schematic diagram illustrating a memory device according to one embodiment of the invention.

FIG. 2A shows a schematic diagram illustrating a memory device having a shared redundancy decision scheme according to one embodiment of the invention. The memory device 20 comprises a memory circuit 20a and a subsequent circuit 20b.

The memory circuit 20a comprises an address receiver 201, a command receiver 202, a command controller 203, a row address generator 204, a column address generator 205, and a shared redundancy decision circuit Srd.

The address receiver 201 receives and converts external address information XADD to generate internal address information ADD.

The command receiver 201 receives and converts an external command XCMD to generate an internal command CMD.

The command controller 203 generates a row latch control signal RLAT or generates a column latch control signal CLAT based on the internal command CMD.

The row address generator 204 receives the internal address information ADD and decides how to convert the internal address based on the row latch control signal RLAT so as to generate a latched row address ADD_ROW.

The column address generator 205 receives the internal address information ADD and decides how to convert the internal address based on the column latch control signal CLAT so as to generate a latched column address ADD_COL.

The shared redundancy decision circuit Srd receives the internal address information ADD and then either generates a row redundancy start signal RHIT based on the internal address information ADD and the row latch control signal RLAT or generates a column redundancy start signal CHIT based on the internal address information ADD and the column latch control signal CLAT. It should be noted that, in one embodiment of the invention, the shared redundancy decision circuit Srd executes the row redundancy decision and the column redundancy decision via time-sharing and generates the row and column redundancy start signals RHIT, CHIT via time-sharing. In another embodiment, the shared redundancy decision circuit Srd executes the row redundancy decision and the column redundancy decision via predetermined order and generates the row and column redundancy start signals RHIT, CHIT based on the predetermined order. Furthermore, in another embodiment to be developed in the future, the shared redundancy decision circuit Srd executes the row redundancy decision and the column redundancy decision substantially simultaneously and generates the row and column redundancy start signals RHIT, CHIT substantially simultaneously.

In the above, when the row redundancy start signal RHIT generated by the shared redundancy decision circuit Srd is at a first voltage level (for example, low voltage level or logic 0), the memory device 20 starts a normal word line circuit 208' of the corresponding latched row address ADD_ROW. When the column redundancy start signal CHIT generated by the shared redundancy decision circuit Srd is at the first voltage level, the memory device 20 starts a normal bit switch circuit 210' of the corresponding latched column address ADD_COL.

When the row redundancy start signal RHIT generated by the shared redundancy decision circuit Srd is at a second voltage level (for example, high voltage level or logic 1), the memory device 20 starts a redundancy word line circuit 209' of the corresponding latched row address ADD_ROW. When the column redundancy start signal CHIT generated by the shared redundancy decision circuit Srd is at the second voltage level, the memory device 20 starts a redundancy bit switch circuit 211' of the corresponding latched column address ADD_COL. It should be noted that, after the shared redundancy decision circuit Srd performs redundancy decision and starts the subsequent circuits, the started circuits can access the data in the storage unit (not shown in the figure) of the memory device 20.

The subsequent circuit 20b comprises a normal word line circuit 208', a redundancy word line circuit 209', a normal bit switch circuit 210', and a redundancy bit switch circuit 211'.

The normal word line circuit 208' comprises a plurality of normal word lines NWL and at least one normal word line controller 208. The normal word lines NWL couple to a plurality of storage units of the memory device 20 (not shown in the figure). The normal word line controller 208 receives the latched row address ADD_ROW and decides whether or not to start the normal word line NWL of the corresponding latched row address ADD_ROW based on the state of the row redundancy start signal RHIT for data accessing.

The redundancy word line circuit 209' comprises a plurality of redundancy word lines RWL and at least one redundancy word line controller 209. The redundancy word lines RWL couple to a plurality of storage units of the memory device 20 (not shown in the figure). The redundancy word line controller 209 receives the latched row address ADD_ROW and decides whether or not to start the redundancy word line RWL of the corresponding latched row address ADD_ROW based on the state of the row redundancy start signal RHIT for data accessing The normal bit switch circuit 210' comprises a plurality of normal bit switches NBS and at least one normal bit switch controller 210. The normal bit switches NBS couple to a plurality of storage units of the memory device 20 (not shown in the figure). The normal bit switch controller 210 receives the latched column address ADD_COL and decides whether or not to start the normal bit switch NBS of the corresponding latched column address ADD_COL based on the state of the column redundancy start signal CHIT for data accessing.

The redundancy bit switch circuit 211' comprises a plurality of redundancy bit switches RBS and at least one redundancy bit switch controller 211. The redundancy bit switches RBS couple to a plurality of storage units of the memory device 20 (not shown in the figure). The redundancy bit switch controller 211 receives the latched column address ADD_COL and decides whether or not to start the redundancy bit switch RBS of the corresponding latched column address ADD_COL based on the state of the column redundancy start signal CHIT for data accessing.

It should be noted that the fast shared redundancy decision scheme of the memory device 20 according to the embodiment of the invention decides to start the normal word line or bit switch or to start the redundancy word line or bit switch based on the received external address information XADD and the external command XCMD including fuse information. If the redundancy decision scheme decides that the external address information XADD received by the memory device 20 corresponds to the redundancy circuits (redundancy word line circuit 209' or redundancy bit switch circuit 211') but not to the normal circuits (normal word line circuit 208' or normal bit switch circuit 210'), it indicates that the received external address information XADD is substantially equal to the address of the fuse. It is because the normal storage unit of this address is verified in advance to be a damaged storage unit and the normal storage unit of this address should be replaced by a redundancy storage unit.

Figure 2B:
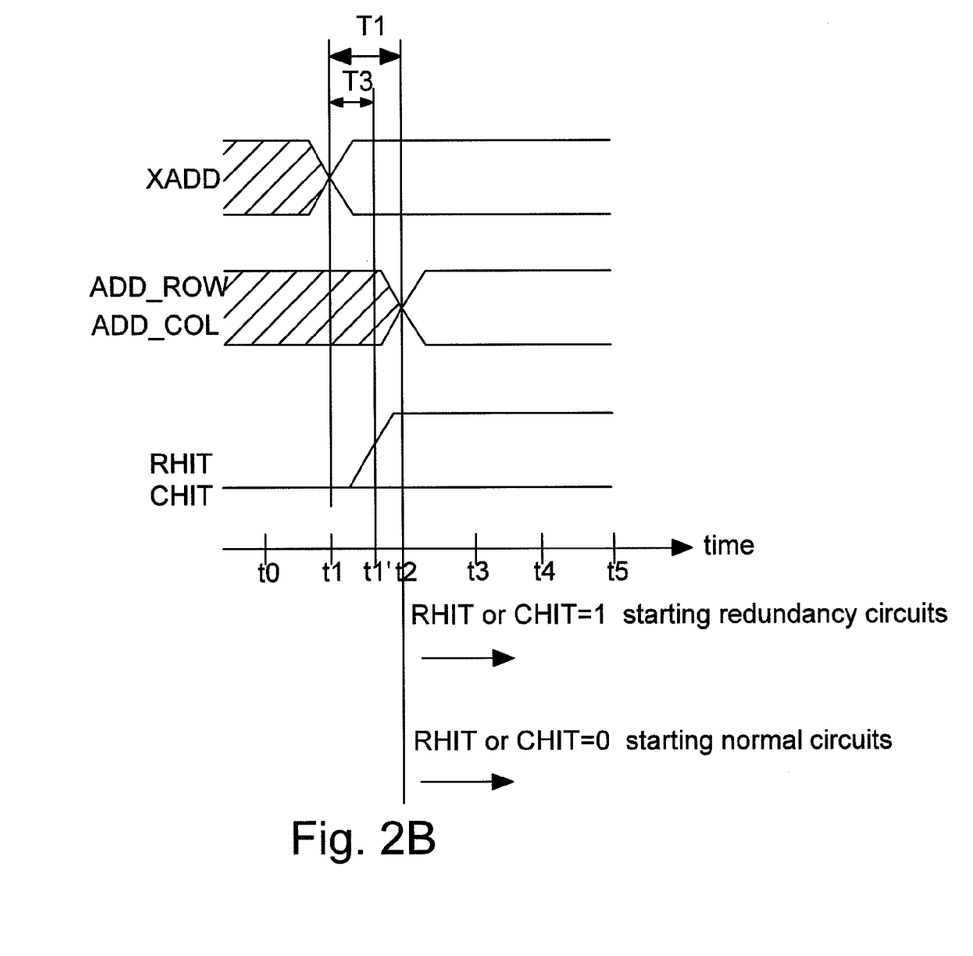
FIG. 2B shows a waveform diagram illustrating the operation of the memory device shown in FIG. 2A.

Accompanying with FIGS. 2A and 2B, the following describes the operating principle and method of the memory device according to the embodiment of the invention.

At first, while the memory device 20 according to the embodiment of the invention is in operation, the address receiver 201 receives the external address information XADD (as a synchronous address signal), converts the external address information XADD into the internal address information ADD, and then outputs the internal address information ADD to the shared redundancy decision circuit Srd, the row address generator 204, and the column address generator 205. The command receiver 202 receives the external command XCMD and generates the internal command CMD. The command controller 203 generates the row latch control signal RLAT or column latch control signal CLAT based on the internal command CMD to control the row address generator 204 or the column address generator 205 to generate the latched row address ADD_ROW or the latched column address ADD_COL. As shown in FIG. 2B, the memory device 20 according to the embodiment of the invention takes the time length T1 from the time t1 completing processing the external address information XADD to the time t2 deciding the latched address ADD_ROW or ADD_COL.

It should be noted that, at the time the row or column address generator 204 or 205 receives the row latch control signal RLAT or column latch control signal CLAT (or substantially at the same time), for example the time t1, the shared redundancy decision circuit Srd also receives the row latch control signal RLAT or column latch control signal CLAT; and generates the row redundancy start signal RHIT at the time t1' based on the above internal address information ADD and the row latch control signal RLAT or generates the column redundancy start signal CHIT at the time t1' based on the above internal address information ADD and the column latch control signal CLAT so that the current address is decided to use the normal circuits or the redundancy circuits. After that, the data in the memory device 20 can be accessed. Therefore, as shown in FIG. 2B, the shared redundancy decision circuit Srd of the memory device 20 takes the time length T3 (T3 is shorter than the predetermined time length T1) from starting redundancy decision operation till completion. In addition, it is completed within the predetermined time length T1. Accordingly, if the predetermined time length T1 is designed properly, before the latched row address ADD_ROW or the latched column address ADD_COL is transmitted to the subsequent circuit 20b, the shared redundancy decision circuit Srd transmits the row or column redundancy start signal RHIT or CHIT to the subsequent circuit 20b in advance. Thus, when the latched row address ADD_ROW or the latched column address ADD_COL is processed and transmitted to the subsequent circuit 20b, the part of the normal circuit or the redundancy circuit decided by the row or column redundancy start signal RHIT or CHIT can be started immediately. Therefore, the problem of requiring the additional time T2 in the prior art to wait for the row or column redundancy decision circuit 106 or 107 to process the latched row or column address ADD_ROW or ADD_COL to generate the row or column redundancy start signal RHIT or CHIT is solved.

Figure 3:
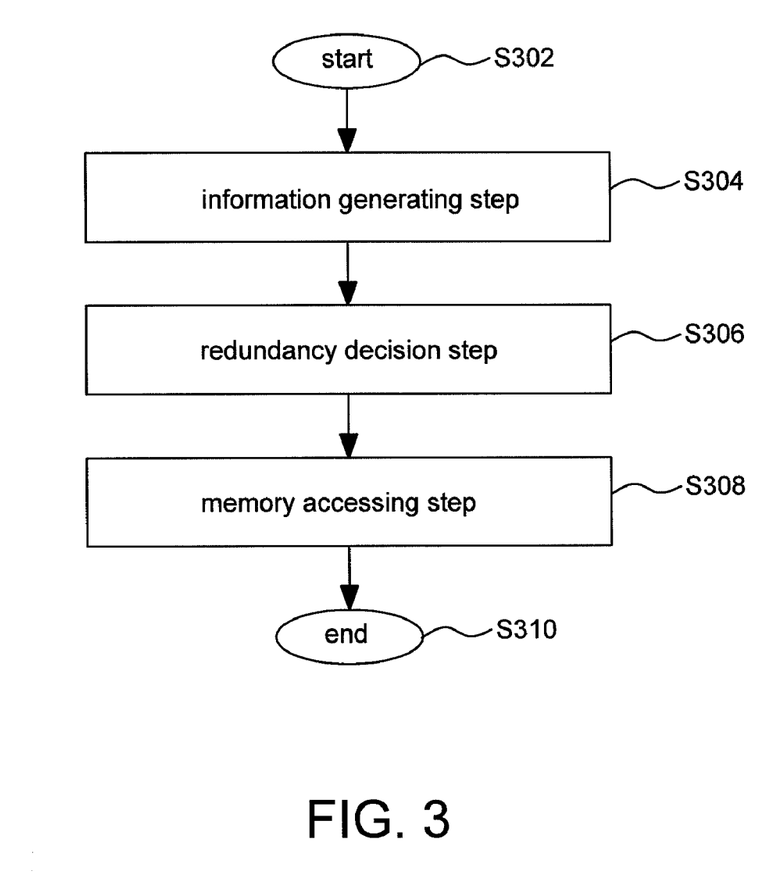
FIG. 3 shows a flow chart illustrating the memory control method according to one embodiment of the invention.

FIG. 3 shows the memory control method according to one embodiment of the invention, comprising the following steps:

Step S302: start;

Step S304: an information generating step for receiving address information and command information to generate a non-latched address, a row latch signal or a column latch signal, and a latched row address or a latched column address;

Step S306: a redundancy decision step for deciding to start the normal circuit of the row or column or to start the redundancy circuit of the row or the column in advance based on the non-latched address and the row latch signal or the column latch signal, before the latched row address or the latched column address is outputted to the normal circuit of the row or column of a storage unit of the memory device or to the redundancy circuit of the row or the column of a storage unit of the memory device;

Step S308: a memory accessing step for accessing data in the memory based on the normal circuit of the row or column or the redundancy circuit of the row or the column; and Step S310 end.

It should be noted that, in one embodiment, the redundancy decision step of the memory control method executes the row and column redundancy decision operations simultaneously. In another embodiment, the redundancy decision step executes the row and column redundancy decision operations via time-sharing. In another embodiment, the redundancy decision step executes the row and column redundancy decision operations based on predetermined order.

The memory device and the memory control method of the embodiments of the present invention utilize the non-latched internal address converted from the external address information and the internal command including fuse information converted from the external command to perform comparison and decision before the row or column address is latched. Through this way, the decision of the redundancy scheme of the memory device of the embodiments of the present invention can be quickly ready before the information of the latched row or column address is transferred to the subsequent circuit like the word line controller or the bit switch controller. The memory device can perform data accessing right after the information of the latched row or column address is ready without taking additional time to wait for generating the row or column redundancy start signal. Moreover, since the memory device according to the embodiments of the present invention utilizes the shared redundancy decision circuit, only one redundancy decision circuit is needed instead of two redundancy decision circuits (row and column redundancy decision circuits) in the prior art so that the production cost can be greatly reduced.

Although the present invention has been fully described by the above embodiments, the embodiments should not constitute the limitation of the scope of the invention. Various modifications or changes can be made by those who are skilled in the art without deviating from the spirit of the invention.

What is claimed is:

1. A memory device, comprising:
    an address receiver, for receiving and converting external address information to generate internal address information;
    a command receiver, for receiving and converting an external command to generate an internal command;
    a command controller, for generating a row latch control signal or generating a column latch control signal according to the internal command;
    a row address generator, for receiving the internal address information and deciding how to convert the internal address according to the row latch control signal so as to generate a latched row address;
    a column address generator, for receiving the internal address information and deciding how to convert the internal address according to the column latch control signal so as to generate a latched column address; and
    a shared redundancy decision circuit, for receiving the internal address information and then either generating a row redundancy start signal according to the internal address information and the row latch control signal or generating a column redundancy start signal according to the internal address information and the column latch control signal;
    wherein, when the row redundancy start signal or column redundancy start signal generated by the shared redundancy decision circuit is at a first voltage level, the memory device starts a normal word line circuit of the corresponding latched row address or starts a normal bit switch circuit of the corresponding latched column address; and, when the row redundancy start signal or column redundancy start signal generated by the shared redundancy decision circuit is at a second voltage level, the memory device starts a redundancy word line circuit of the corresponding latched row address or starts a redundancy bit switch circuit of the corresponding latched column address.

2. The device according to claim 1, wherein the time when the shared redundancy decision circuit generates the row redundancy start signal is earlier than or substantially the same as the time when the row address generator generates the latched row address.

3. The device according to claim 1, wherein the time when the shared redundancy decision circuit generates the column redundancy start signal is earlier than or substantially the same as the time when the column address generator generates the latched column address.

4. The device according to claim 1, wherein predetermined time from receiving the external address information by the address receiver till generating the latched row address by the row address generator is required and the time from receiving the external address information by the address receiver till generating the row redundancy start signal by the shared redundancy decision circuit is less than the predetermined time.

5. The device according to claim 1, wherein predetermined time from receiving the external address information by the address receiver till generating the latched column address by the column address generator is required and the time from receiving the external address information by the address receiver till generating the column redundancy start signal by the shared redundancy decision circuit is less than the predetermined time.

6. The device according to claim 1, wherein the first voltage level is a low voltage level or logic 0 or the second voltage level is a high voltage level or logic 1.

7. The device according to claim 1, wherein the shared redundancy decision circuit executes the row redundancy decision and the column redundancy decision substantially simultaneously and generates the row and column redundancy start signals substantially simultaneously.

8. The device according to claim 1, wherein the shared redundancy decision circuit executes the row redundancy decision and the column redundancy decision via time-sharing and generates the row and column redundancy start signals via time-sharing.

9. The device according to claim 1, wherein the shared redundancy decision circuit executes the row redundancy decision and the column redundancy decision via predetermined order and generates the row and column redundancy start signals based on the predetermined order.

10. The device according to claim 1, wherein the normal word line circuit comprises:
    a plurality of normal word lines, coupling to a plurality of storage units of the memory device; and
    at least one normal word line controller, for receiving the latched row address and deciding whether or not to start the normal word line of the corresponding latched row address based on the state of the row redundancy start signal for data accessing.

11. The device according to claim 1, wherein the redundancy word line circuit comprises:
    a plurality of redundancy word lines, coupling to a plurality of storage units of the memory device; and
    at least one redundancy word line controller, for receiving the latched row address and deciding whether or not to start the redundancy word line of the corresponding latched row address based on the state of the row redundancy start signal for data accessing.

12. The device according to claim 1, wherein the normal bit switch circuit comprises:
    a plurality of normal bit switches, coupling to a plurality of storage units of the memory device; and
    at least one normal bit switch controller, for receiving the latched column address and deciding whether or not to start the normal bit switch of the corresponding latched column address based on the state of the column redundancy start signal for data accessing.

13. The device according to claim 12, wherein the redundancy bit switch circuit comprises:

a plurality of redundancy bit switches, coupling to a plurality of storage units of the memory device; and at least one redundancy bit switch controller, for receiving the latched column address and deciding whether or not to start the redundancy bit switch of the corresponding latched column address based on the state of the column redundancy start signal for data accessing.

14. A memory device, comprising:

a memory circuit, for receiving address information and command information to generate a non-latched address, a row latch signal or a column latch signal, and a latched row address or a latched column address; and a shared redundancy decision circuit, for deciding to start the normal circuit of the row or column or to start the redundancy circuit of the row or the column in advance based on the non-latched address and the row latch signal or the column latch signal, before the latched row address or the latched column address is outputted to the normal circuit of the row or column of a storage unit of the memory device or to the redundancy circuit of the row or the column of a storage unit of the memory device.

15. The device according to claim 14, wherein the shared redundancy decision circuit executes the row redundancy decision and the column redundancy decision substantially simultaneously.

16. The device according to claim 14, wherein the shared redundancy decision circuit executes the row redundancy decision and the column redundancy decision via time-sharing.

17. The device according to claim 14, wherein the shared redundancy decision circuit executes the row redundancy decision and the column redundancy decision via predetermined order.

18. A memory control method, comprising:

receiving address information and command information to generate a non-latched address, a row latch signal or a column latch signal, and a latched row address or a latched column address;

performing redundancy decision by deciding to start the normal circuit of the row or column or to start the redundancy circuit of the row or the column in advance based on the non-latched address and the row latch signal or the column latch signal, before the latched row address or the latched column address is outputted to the normal circuit of the row or column of a storage unit of the memory device or to the redundancy circuit of the row or the column of a storage unit of the memory device; and accessing data in the memory based on the normal circuit of the row or the column or the redundancy circuit of the row or the column.

19. The method according to claim 18, wherein the shared redundancy decision circuit executes the row redundancy decision and the column redundancy decision substantially simultaneously.

20. The method according to claim 18, wherein the shared redundancy decision circuit executes the row redundancy decision and the column redundancy decision via time-sharing.

21. The method according to claim 18, wherein the shared redundancy decision circuit executes the row redundancy decision and the column redundancy decision via predetermined order.

* * * * *